United States Patent [19]

Swei et al.

[11] Patent Number: 5,374,453
[45] Date of Patent: Dec. 20, 1994

[54] PARTICULATE FILLED COMPOSITE FILM AND METHOD OF MAKING SAME

[75] Inventors: Gwo S. Swei, Northboro; David J. Arthur, Norwood, both of Mass.

[73] Assignee: Rogers Corporation, Rogers, Conn.

[21] Appl. No.: 90,488

[22] Filed: Jul. 13, 1993

Related U.S. Application Data

[63] Continuation of Ser. No. 705,625, May 24, 1991, abandoned.

[51] Int. Cl.$^5$ ................................................. B05D 3/02
[52] U.S. Cl. ..................................... 427/226; 427/244; 427/245; 521/61; 521/62
[58] Field of Search .................. 427/226, 244, 245; 521/61, 62

[56] References Cited

U.S. PATENT DOCUMENTS

| | | | |
|---|---|---|---|
| 2,710,266 | 6/1955 | Hochberg | 117/103 |
| 2,852,811 | 9/1958 | Petriello | 18/57 |
| 2,923,651 | 2/1960 | Petriello | 154/80 |
| 2,945,831 | 7/1960 | Evans et al. | 260/29.6 |
| 2,961,345 | 11/1960 | Petriello | 117/138.8 |
| 2,980,965 | 4/1961 | Infantino et al. | 18/57 |
| 3,054,716 | 9/1962 | Bergstein et al. | 156/246 |
| 3,054,761 | 9/1962 | Moore et al. | 260/2.5 |
| 3,282,725 | 11/1966 | Van Zalingo | 117/64 |
| 3,518,332 | 6/1970 | Sklarchuk et al. | 264/127.8 |
| 3,556,161 | 1/1971 | Roberts | 138/141 |
| 3,577,508 | 5/1971 | Desaulniers | 264/331 |
| 3,679,614 | 7/1972 | Shah et al. | 264/127 X |
| 3,843,570 | 10/1974 | Murayama | 210/500 X |
| 4,049,589 | 7/1977 | Sakane | 521/64 |
| 4,112,037 | 9/1978 | Parker et al. | 264/126 |
| 4,183,991 | 1/1980 | Smiley et al. | 428/220 |
| 4,196,070 | 11/1980 | Chao et al. | 264/49 X |
| 4,203,848 | 5/1980 | Grandine, II | 264/216 X |
| 4,211,603 | 7/1980 | Reed | 156/659.1 |
| 4,307,142 | 12/1981 | Blitstein et al. | 428/143 |
| 4,380,521 | 4/1983 | Moreno et al. | 264/127 X |
| 4,393,119 | 7/1983 | Concannon | 428/413 |
| 4,409,354 | 10/1983 | Namba et al. | 524/431 |
| 4,434,116 | 2/1984 | Covitch | 264/216 X |
| 4,500,603 | 2/1985 | Freundlich | 428/409 |
| 4,555,543 | 11/1985 | Effenberger et al. | 524/520 |
| 4,610,918 | 9/1986 | Effenberger et al. | 428/245 |
| 4,692,287 | 9/1987 | Timmons | 264/127 X |
| 4,818,619 | 4/1989 | Stepparola et al. | 428/421 |
| 4,824,511 | 4/1989 | Hartman et al. | 156/306.6 |
| 4,847,135 | 7/1989 | Braus et al. | 428/138 |
| 4,849,284 | 7/1989 | Arthur et al. | 428/325 |
| 4,883,716 | 11/1989 | Effenberger et al. | 428/421 |
| 4,888,245 | 12/1989 | Witzko | 428/421 |
| 4,895,756 | 1/1990 | Suzuki | 428/317.9 |
| 4,915,983 | 4/1990 | Lake et al. | 427/98 |
| 4,985,296 | 1/1991 | Mortimer, Jr. | 428/220 |
| 4,990,544 | 2/1991 | Asaumi et al. | 521/145 |

FOREIGN PATENT DOCUMENTS

| | | |
|---|---|---|
| 0198375 | 10/1986 | European Pat. Off. |
| 246844 | 11/1987 | European Pat. Off. |
| 1161755 | 8/1969 | United Kingdom |
| 1321428 | 6/1973 | United Kingdom |
| 2071112 | 9/1981 | United Kingdom |

*Primary Examiner*—Michael Lusignan
*Attorney, Agent, or Firm*—Fishman, Dionne & Cantor

[57] ABSTRACT

A method for making a particulate filled polymeric matrix composite film includes mixing a polymeric matrix material with a dispersion of particulate filler in a carrier liquid to form a casting composition and adjusting the viscosity of the casting composition to retard separation of the particulate filler from the composition. A layer of the viscosity-adjusted casting composition is cast on a substrate and the layer is consolidated to form the particulate filled polymer matrix composite film. Films made by the method include very thin, e.g less than 1.0 mil, fluoropolymeric matrix films highly filled with very small diameter, preferably spherical, particles for use as, e.g. dielectric substrate materials in laminar electrical circuits.

24 Claims, 1 Drawing Sheet

PARTICULATE FILLED COMPOSITE FILM AND METHOD OF MAKING SAME

TECHNICAL FIELD

This is a continuation of copending application(s) Ser. No. 07/705,625 filed on May 24, 1991, now abandoned.

The present invention relates to particulate filled polymer matrix composite materials and methods of manufacturing same and more particularly to thin films of highly filled polymer matrix composite materials.

BACKGROUND OF THE INVENTION

Laminated electrical circuit substrates which include a conductive layer supported on a dielectric fluoropolymer matrix composite layer are known. Driven by the continuing trend toward increasing circuit density, very thin films, e.g. less than about 1.0 mil, of highly filled fluoropolymeric matrix composite substrate materials having a substantially uniform microstructure have become desirable as allowing further reduction in the size of electronic circuits. It is technically and economically difficult to make such materials by known methods.

Fluoropolymer and particulate filled fluoropolymer matrix composite films are made by known papermaking, skiving, casting, melt extrusion and paste extrusion and calendering processes.

Films produced by paper making processes required fiber reinforcement and are limited to thicknesses greater than about 2 mil.

It is very difficult to produce thin high quality highly filled fluoropolymer matrix films by skiving due to abrasion of the skiving blade by the filler particles and tearing of the film associated with the resistance of the filler particles to the skiving blade.

The filler loading of films made by known casting processes is limited to less than about 15 volume percent.

The high melt viscosity of neat fluoropolymers complicates the production of fluoropolymer films by melt extrusion. Polyvinylidene fluoride ($PVF_2$) and polychlorotrifluoroethylene (PCTFE) are melt extrudable only within a narrow processing window. Polyvinylfluoride (PVF) film cannot be produced by melt extrusion due to thermal instability. Polytetrafluoroethylene (PTFE) cannot be melt extruded due to its extraordinarily high melt viscosity. Fluorocopolymers are known which provide lower melting temperature and lower melt viscosity at extrusion temperatures, e.g. copolymers of tetrafluoroethylene with hexafluoropropylene (FEP) or with ethylene, copolymers of CTFE with vinylidene fluoride or hexafluoropropylene.

The introduction of fillers further complicates the melt extrusion of fluoropolymers. In the presence of certain fillers, especially at high filler loading level, the melt processability of the melt extrudable fluoropolymers is rapidly degraded due to the increase in melt viscosity associated with the presence of the filler or with filler-catalyzed thermal degradation of the polymer matrix.

A method of making highly filled PTFE composite materials which exhibit excellent physical and electrical properties by paste extrusion and calendering is set forth in coassigned U.S. Pat. No. 4,849,284 to D.J. Arthur, J.C. Mosko, C.S. Jackson and G.R. Traut, entitled "ELECTRICAL SUBSTRATE MATERIAL", the disclosure of which is incorporated herein by reference.

However, it is technically difficult and economically extremely difficult to produce thin, i.e. less than 2 mils, highly filled, i.e. greater than about 40%, fluoropolymer matrix composite films by the paste extrusion and calendering process.

What is needed in the art is a method which overcomes the above noted deficiencies of known processing methods.

SUMMARY OF THE INVENTION

A particulate filled fluoropolymer matrix composite article is disclosed. The article includes a fluoropolymer matrix and up to about 95 vol. % filler particles distributed throughout the matrix, wherein said particles have a maximum equivalent spherical diameter of less than about 10 microns.

In an alternative embodiment, a particulate filled fluoropolymer matrix composite article comprises a fluoropolymer matrix and up to about 95 vol. % filler particles distributed throughout the matrix wherein none of the particles have a single linear dimension greater than about 10 microns.

In a preferred embodiment a particulate filled fluoropolymer matrix composite film comprises a nonfibrillated fluoropolymer matrix and greater than about 15 vol. percent filler particles distributed throughout the matrix. The film has a thickness less than about 2 mils and is free of visually evident pin holes or tears.

A porous fluoropolymer film comprising a nonfibrillated fluoropolymer matrix having a void volume of greater than about 15 vol. % and a thickness of less than about 2 mils is disclosed.

A method for making a particulate filled polymer matrix composite film is disclosed. The method comprises mixing the polymer with a dispersion of the particulate filler in a carrier liquid to provide a casting composition, wherein the casting composition includes relative amounts of polymer and filler effective to provide a film having greater than 15 volume percent filler casting a layer of the casting composition onto a substrate and consolidating the cast layer to form the particulate filled polymer matrix composite film.

A casting composition is also disclosed. The casting composition includes a mixture of liquid carrier, a polymeric matrix material, and particles of a filler material.

DETAILED DESCRIPTION OF THE INVENTION

Figure 1:
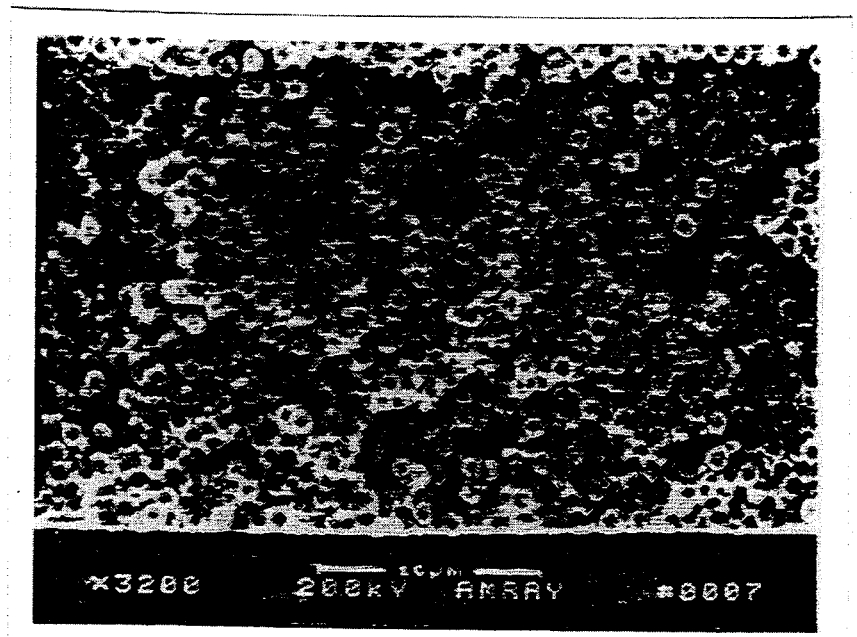
FIG. 1 shows a photomicrograph of a cross sectional view of a particulate filled polymer matrix composite film of the present invention.

Suitable fluoropolymer matrix materials include fluorinated homopolymers, e.g. polytetrafluoroethylene (PTFE) and polychlorotrifluoroethylene (PCTFE) and fluorinated copolymers, e.g. copolymers of tetrafluoroethylene with a monomer selected from the group consisting of hexafluoropropylene and perfluoroalkylvinylethers, copolymers of tetrafluoroethylene with a monomer selected from the group consisting of vinylidene fluoride, vinyl fluoride and ethylene, and copolymers of chlorotrifluoroethylene with a monomer selected from the group of hexafluoropropylene, perfluoroalkylvinylethers, vinylidene fluoride, vinyl fluoride and ethylene. Blends of the above listed fluoropolymers and terpolymers formed from the above listed monomers are also suitable as the fluoropolymer matrix material of the present invention.

Alternatively, polymer matrix material of the present invention may comprise a thermoplastic or thermosetting polymer other than a fluoropolymer. Suitable alternative polymeric matrix materials include, e.g. polyolefins, polyimides, epoxy resins and cyanate esters. Specific examples of suitable polymer matrix materials include polyethylene, polymethylpentene, and polybutadiene.

The particulate filler material of the present invention may include any organic or inorganic particulate material. The terms "particulate" and "particles" as used herein are intended to include fibers. Suitable inorganic filler materials include, e.g. glass particles, ceramic particles, metallic particles, carbon particles and mineral particles. Specific examples of suitable particles include glass beads, glass microspheres, glass fibers, silica particles, carbon black, titanium dioxide particles and barium titanate particles. Silica particles, particularly amorphous fused silica particles and silica particles made by a sol gel process, and glass particles, are preferred filler particles for applications, e.g. dielectric layers of laminar electrical circuits, requiring a low dielectric constant.

Specific examples of suitable polymeric particulate fillers include polymethylmethacrylate particles, polystyrene particles and polyimide particles. Suitable polymeric particles, e.g. LARC-TP1 (Rogers, Corp.), P-84 (Lenzing).

The shape of the filler particles, the size of the filler particles and the size distribution of the filler particles are important parameters with regard to characterizing the particle filled composite article of the present invention.

In a preferred embodiment of the present invention all particles of the particulate filler exhibit an equivalent spherical diameter of less than about 10 microns ($\mu$m). As used herein the "equivalent spherical diameter" of a filler particle is the diameter of a sphere which occupies the same volume as that occupied by the filler particle.

In an alternative preferred embodiment of the present invention, each of the filler particles exhibit no single linear dimension greater than about 10 $\mu$m.

For extremely thin films and in applications where a substantially uniform microstructure is an important characteristic of the film, it is preferred that all particles of the particulate filler exhibit an equivalent spherical diameter of less than about 5 $\mu$m. Alternatively, it is preferred that all particles of the particulate filler exhibit no single linear dimension greater than about 5 $\mu$m.

In a preferred embodiment of the present invention each of the filler particles is substantially spherical. The use of spherical filler particles provides improved processability by minimizing the filler surface area for a given particle size and filler loading. Furthermore, spherical particles provide isotropic properties to the film since the spherical particles do not become oriented during processing.

In a preferred embodiment of the present invention, the filler particles of the film are of a uniform size. The use of a monodisperse filler, i.e. wherein all the filler particles are of substantially the same size, provides a more homogeneous film having substantially uniform properties throughout.

In a particularly preferred embodiment of the present invention, the filler particles comprise spherical silica particles of a substantially uniform size, i.e. all particles within plus or minus 10% of a nominal particle diameter. A pure silica powder known as GELSIL$^R$ produced by Geltech, Inc. and specified as :1 micron sphere size ($+/-$ 10%); density of 2.2 grams/cm$^2$; free of hard agglomerations, has been found to be particularly suitable for use in the practice of the present invention.

The particulate filler material may be treated with a surface treatment to improve the moisture resistance and improve the mechanical properties of the composite film of the present invention.

The hydrophobic coating of the present invention may comprise any coating material that is thermally stable, exhibits a low surface energy, and improves the moisture resistance of the composite of the present invention. Suitable coating materials, include conventional silane coatings, titanate coatings and zirconate coatings. Preferred silane coatings include: phenyltrimethoxysilane, phenyltriethoxysilane, 3,3,3-trifluoropropyltrimethoxysilane, (tridecafluoro-1,1,2,2-tetrahydrodecyl)-1-triethoxysilane and mixtures thereof. Further examples of suitable fluorinated silane compounds are set forth in coassigned U.S. application Ser. No. 279,474, filed Dec. 2, 1988 and entitled "FLUOROPOLYMER COMPOSITE" by D.J. Arthur and G.S. Swei, the disclosure of which is incorporated herein by reference. Suitable titanate coatings include: neopentyl(diallyl)oxytrineodecanoyl titanate, neopentyl(diallyl)oxytri(dioctyl)phosphate titanate. Suitable zirconate coatings include: neopentyl(diallyl)oxytri(dioctyl)pyrophosphate zirconate and neopentyl(diallyl)oxytri(N-ethylenediamino)ethyl zirconate. Further examples of suitable titanate and zirconate coatings are set forth in coassigned U.S. application Ser. No. 483,501, field Feb. 21, 1990 and entitled "CERAMIC FLUOROPOLYMER", by D.J. Arthur and G.S. Swei, the disclosure of which is incorporated herein by reference.

The hydrophobic coating is used in an amount effective to render the surfaces of the filler particles hydrophobic and compatible with the matrix material. The amount of coating relative to the amount of inorganic particles coated will vary with the surface area coated and density of the inorganic particles. Preferably, the coated inorganic particles of the present invention include from about 0.5 parts by weight (pbw) hydrophobic coating: 100 pbw inorganic particles to about 25 pbw hydrophobic coating: 100 pbw inorganic particles.

The polymer matrix material of the present invention is mixed with a first carrier liquid. The mixture may comprise a dispersion of polymeric particles in the first carrier liquid, a dispersion, i.e. an emulsion, of liquid droplets of the polymer or of a monomeric or oligomeric precursor of the polymer in the first carrier liquid or a solution of the polymer in the first carrier liquid.

The choice of the first carrier liquid is based on the particular polymeric matrix material and the form in which the polymeric matrix material is to be introduced to the casting composition of the present invention. If it is desired to introduce the polymeric material as a solution, a solvent for the particular polymeric matrix material is chosen as the carrier liquid, e.g. N-methyl pyrrolidone (NMP) would be a suitable carrier liquid for a solution of a polyimide. If it is desired to introduce the polymeric matrix material as a dispersion, then a suitable carrier liquid is a liquid in which the matrix material is not soluble, e.g. water would be a suitable carrier liquid for a dispersion of PTFE particles and would be a suitable carrier liquid for an emulsion of polyamic acid or an emulsion of butadiene monomer.

Preferably, a fluoropolymeric matrix material is introduced as an aqueous dispersion. A dispersion of PTFE in water known as Teflon[R] TE 30 made by DuPont has been found to be particularly suitable for use in the practice of the present invention.

A dispersion of the particulate filler of the present invention in a suitable second carrier liquid, i.e. a liquid in which the filler is not soluble. The second carrier liquid may be the same liquid or may be a liquid other than the first carrier liquid that is miscible with the first carrier liquid. For example, if the first carrier liquid is water, the second carrier liquid may comprise water or an alcohol. Preferably, the second carrier liquid is water.

The dispersion of filler particles may include a surfactant in an amount effective to modify the surface tension of the second carrier liquid to enable the second carrier liquid to wet the filler particles. Suitable surfactant compounds include ionic surfactants and nonionic surfactants. Triton X-100 (Rohm & Haas) has been found to be a suitable surfactant for use in aqueous filler dispersions.

Preferably, the filler dispersion comprises from about 10 volume percent (vol. %) to about 50 vol. % filler particles, from about 0.1 vol. % to about 10 vol. % surfactant, with the remainder comprising the second carrier liquid.

The mixture of the polymeric matrix material and first carrier liquid and the dispersion of the filler particles in the second carrier liquid are combined to form the casting composition of the present invention. Preferably, the casting composition comprises from about 10 vol. % to about 60 vol. % of the combined polymeric matrix material and filler particles and from about 40 vol. % to about 90 vol. % combined first and second carrier liquids. The combined amount of polymeric matrix material and filler particles may include from 15 vol. % to about 95 vol. to filler particles. Preferably, the combined amount of polymeric matrix material and filler particles includes from about 30 vol. % to about 70 vol. % filler particles. Most preferably, the combined amount of polymeric matrix material and filler particles includes from about 40 vol. % to about 65 vol. % filler particles.

The viscosity of the casting composition of the present invention is adjusted by the addition of suitable viscosity modifier, chosen on the basis of its compatibility in a particular carrier liquid or mixture of carrier liquids, to retard separation, i.e. sedimentation or flotation, of the filler particles from the casting composition and to provide a casting composition having a viscosity compatible with conventional casting equipment. Conventional thickening agents are suitable and are chosen on the basis of the carrier liquid selected. Conventional viscosity modifiers suitable for use in aqueous casting compositions include, e.g. polyacrylic acid compounds, vegetable gums and cellulose based compounds. Specific examples of suitable viscosity modifiers include polyacrylic acid, methyl cellulose, polyethyleneoxide, guar gum, locust bean gum, sodium carboxymethylcellulose, sodium alginate and gum tragacanth.

A minimum viscosity of the viscosity-adjusted casting composition is defined according to Stoke's law, i.e.

$$v = \frac{gD_p^2(\rho_p - \rho_L)}{18u}$$

wherein:
  $v$ = terminal velocity of particle;
  $g$ = gravitational constant;
  $D_p$ = particle diameter;
  $\rho_p$ = particle density;
  $\rho_L$ = liquid density; and
  $u$ = liquid viscosity. on the basis of the size and density of the filler particles to provide a theoretical terminal viscosity, i.e. a filler separation rate, that provides a casting composition that is stable within the time period of interest, i.e. the time period between mixing the casting composition and consolidating the film cast from the composition. For example, substitution according to the above relationship reveals that an aqueous solution having a viscosity of 10,000 cp provides a theoretically terminal velocity of $6.5 \times 10^{-10}$ cm/s for silica particles (density=2.2 g/cm$^3$) having a diameter of 1 um. The viscosity of the viscosity-adjusted casting composition may be further increased, i.e. beyond the minimum viscosity, on an application by application basis to adapt the casting composition to the selected casting technique. For example, a viscosity of about 300 cp to about 1000 cp is preferred for metering rod casting.

Preferably, the viscosity adjusted casting composition exhibits a viscosity between about 10 cp and about 100,000 cp. Most preferably, the viscosity adjusted casting composition exhibits a viscosity between about 100 cp and 10,000 cp.

Alternatively, the viscosity modifier may be omitted if the viscosity of the carrier liquid is sufficient to provide a casting composition that does not separate during the time period of interest. Specifically, in the case of extremely small particles, e.g. particles having an equivalent spherical diameter less than 0.1 um, the use of a viscosity by modifier may not be necessary.

A layer of the viscosity-adjusted casting composition is cast on a substrate by conventional methods, e.g. dip coating, reverse roll coating, knife-over-roll, knife-over-plate, and metering rod coating.

Suitable substrate materials include, e.g. metallic films, polymeric films or ceramic films. Specific examples of suitable substrates include stainless steel foil, polyimide films, polyester films, fluoropolymer films.

The carrier liquid and processing aids, i.e. the surfactant and viscosity modifier, are removed from the cast layer, e.g. by evaporation and/or by thermal decomposition, to consolidate a film of the polymeric matrix material and the particulate filler. Preferably, the particulate filled polymeric matrix composite film of the present invention is consolidated by heating to evaporate the carrier liquid.

The composition of the consolidated film corresponds to that of the combined amount of polymeric matrix material and filler particles set forth above in regard to the casting composition, i.e. the film may comprise from 15 vol. % to about 95 vol. % filler particles and from about 5 vol. % to 85 vol. % matrix material, preferably comprises from about 30 vol. % to about 70 vol. % filler particles and from 30 vol. % to about 70 vol. % matrix material and most preferably comprises from about 40 vol. % to about 65 vol. % filler particles and from about 35 vol. % to about 60 vol. % matrix material.

The consolidated film of polymeric matrix material and particulate filler may be further heated to modify the physical properties of the film, e.g. to sinter a thermoplastic matrix material or to cure and/or post cure a thermosetting matrix material.

The process of the present invention allows films having thickness below about 2 mils, and even less than 1 mil, to be economically produced. Film thicknesses are set forth herein in terms of "mils", wherein one mil is equal to 0.001 inch.

Since the process of the present invention allows thin films to be produced without deforming the film, e.g. without calendering or expanding the film, fluoropolymer matrix films can be made without the fibrillation of the matrix material characteristic of expanded films and without the associated danger of tearing or forming pinholes in the film.

If a porous film is being produced, the filler material is removed from the consolidated film. The method of removal is dependent upon the choice of filler material. If a filler material is dispersed in a matrix material wherein the matrix exhibits much higher temperature resistance than the filler material, e.g. a polymethylmethacrylate filler in a PTFE matrix the filler material can be removed thermally during the consolidation and sintering steps. Alternatively, the filler material can be dissolved in a liquid in which the filler is soluble, but within the matrix material is insoluble. Removal of filler materials from a fluorinated polymer matrices to form a porous fluoropolymer film is described in coassigned U.S. Pat. No. 4,987,274, entitled "COAXIAL CABLE INSULATION AND COAXIAL CABLE MADE THEREWITH", by T.L. Miller, W.R. Zelanis, G.A. Woerner and A.F. Horn III, the disclosure of which is incorporated herein by reference.

It should be noted that the fluoropolymer matrix of the thin porous fluoropolymer film of the present invention does not exhibit the fibrillar structure characteristic of expanded porous PTFE films.

The substrate and consolidated film may be used in combination as a laminar composite material or as a substrate for subsequent composite layers. Alternatively, the substrate may be removed from the film. The substrate may be destructively removed, e.g. by dissolution in a solvent, by chemical reaction, or thermal degradation, or the substrate may be reusably removed, e.g. by overcoming interfacial adhesion between the cast film and the substrate.

The consolidated film may be used alone, e.g. as discussed below, or as the substrate for subsequent casting of further layers of the casting composition to build up a multilayer film.

The thin particulate filled fluoropolymeric matrix composite of films of the present invention have a wide range of potential applications.

Figure 2:
FIG. 2 shows a laminar circuit substrate made by the process of the present invention.

A laminar circuit substrate made by the process of the present invention is shown in FIG. 2. The substrate comprises a conductive layer 2 laminated with a particle filled fluoropolymer composite layer 4. The laminar substrate shown in FIG. 2 can be made, e.g. by casting and consolidating layer 4 on a layer of the conductive film 2.

As discussed above, the shape, size distribution of the filler particles is very important in several applications.

Film thickness is a very important consideration in applications where a particulate filled film is used as a dielectric substrate for a high density laminar electrical circuit. As the feature dimensions of the circuit are decreased, it becomes desirable to correspondingly reduce the thickness of the dielectric layer to thereby preserve the characteristic impedance of the circuit.

In general, it is desirable that the longest characteristic dimension of the filler particles, is significantly, e.g. by a factor of 10, less than the thickness of the particulate filled film to avoid bridging of particles between the surfaces of the film. As the desired film thickness decreases it becomes progressively more difficult to meet the criterion.

Figure 3:
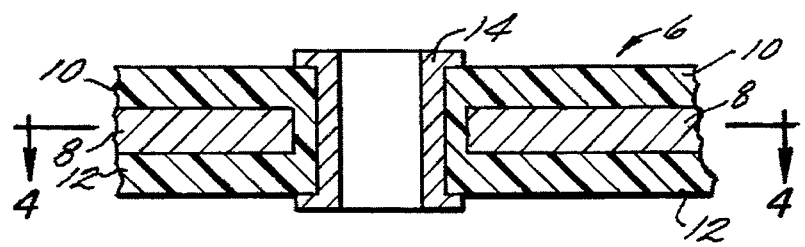
FIG. 3 shows a cross sectional view of a conductive through-hole communicating between layers of a portion of a laminated electrical circuit.
Figure 4:
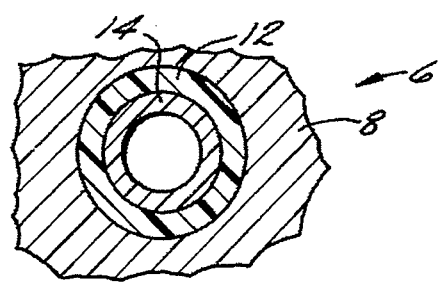
FIG. 4 shows a cross sectional view taken along lines 4—4 of FIG. 3.

Another outgrowth of increasing circuit density is illustrated in FIGS. 3 and 4. A portion of a conventional laminar circuit 6 includes conductive layer 8 encased within dielectric layers 10, 12. A conductive through hole, i.e. a "via", is defined by a conductive sleeve 14. The conductive sleeve 14 is separated from the conductive layer 8 by an insulating sleeve region 16 of dielectric material formed by fusing the edges of the dielectric layers 10, 12. With increasing circuit density it is desirable to decrease the dimension of the conductive through hole. As the distance between the conductive sleeve 14 and the conductive layer 8 is decreased, filler size must be correspondingly decreased to avoid bridging of filler particles between the conductive sleeve 14 and conductive layer 8.

A further aspect of increasing circuit density and decreasing via hole diameter is the need to drill smaller via holes. As the via hole diameter decreases, filler particle size becomes an important factor in hole quality. Laser drilling of particulate filled fluoropolymer matrix films is described in coassigned U.S. Pat. No. 4,915,981, entitled "METHOD OF LASER DRILLING FLUOROPOLYMER MATERIALS", by R.T. Traskos, C.A. Fleischer, C.A. Barton and D.B. Noddin, the disclosure of which is incorporated herein by reference. Laser drilling is effective at removing precise amounts of matrix material but literally blasts whole chunks of filler particles from the hole being drilled. Consequently, the use of small filler particles allows higher quality, i.e. more precisely defined, small diameter holes to be laser drilled.

Figure 5:
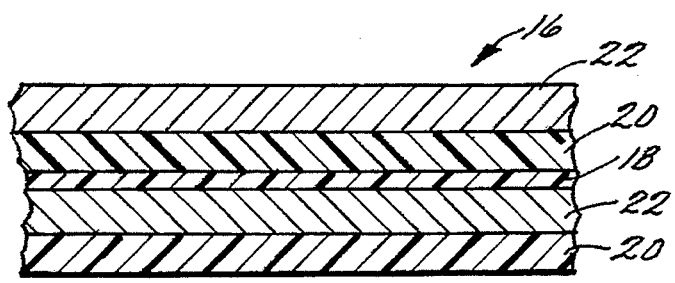
FIG. 5 shows a cross sectional view of a portion of a laminar electrical circuit.

FIG. 5 shows a portion of a laminar electrical circuit 16 which includes a bondply layer 22 sandwiched between a pair of laminated circuit layers each comprising a conductive layer 22 supported on a dielectric layer 20. The casting process of the present invention can be used with a lower melting fluoropolymer matrix material, e.g. FEP, to produce very thin, highly filled bondplys for use in laminar electrical circuits. The ability to make a highly filled fluoropolymer matrix bondply would provide electrical properties similar to those of the substrate layers being bonded, while the ability to make a very thin bondply would minimize the detrimental effect of the bondply layer on the dimensional stability of the laminar circuit.

The ability to produce very thin, highly filled fluoropolymer films with an ordered microstructure is also of advantage in regard to circuit substrate materials for "mm-wave" applications which require very thin films having physical and electrical properties which, given the frame of reference provided by the short wavelength radiation involved, can be considered substantially uniform for purposes of the particular application.

An inorganic particle filled matrix composite layer may be cast onto a polyimide film to produce a composite film suitable for use in flex circuit applications. A flexible circuit including a microglass reinforced fluoropolymer matrix composite layer sandwiched between a polyimide film and a copper conductive pattern is described in coassigned U.S. Pat. No. 4,634,631, by S. Gazit and C.A. Fleischer entitled "FLEXIBLE CIRCUIT LAMINATE AND METHOD OF MAKING THE SAME", the disclosure of which is incorporated herein by reference.

ASE 75, available from Rohm & Haas) to provide a coating composition having a viscosity of 1000 cp.

The viscosity-adjusted casting composition was cast on to a 2 mil thick stainless steel foil with a laboratory scale knife-over-plate coater apparatus. The cast film was dried at 550° F. for 1 hour and sintered at 700° for 10 minutes.

The matrix material, filler material, coating material, the amount of coating (expressed as weight percent of filler particles) and the film composition expressed as vol. % coated filler/vol. % matrix material, for a number of sample film compositions are given in TABLE 1.

The water absorption (24 hour immersion in 50° C. water) and specific gravity of sample film composition 1 and 4 were determined and are also set forth in TABLE 1.

TABLE 1

| SINGLE FILM COMPOSITION | 1 | 2 | 3 | 4 | 5 | 6 | 7 | 8 | 9 |
|---|---|---|---|---|---|---|---|---|---|
| MATRIX MATERIAL | PTFE[a] | PTFE[a] | PTFE[a] | PTFE[c] | PTFE[a] | PTFE[a] | PTFE[a] | FEP[b] | PTFE[c] |
| FILLER MATERIAL | SILICA[d] | SILICA[e] | GLASS[f] | SILICA[g] | TiO$_2$[h] | SILICA[i] | BARIUM TITANATE[j] | SILICA[d] | SILICA[d] |
| COATING MATERIAL | SILANE[k] | SILANE[k] | SILANE[k] | SILANE[l] | SILANE[m] | SILANE[m] | SILANE[m] | SILANE[k] | SILANE[k] |
| COATING AMOUNT (wt % filler) | 2% | 10% | 2% | 10% | 4% | 2% | % | 2% | 2% |
| VOL % FILLER/ VOL % MATRIX MATERIAL | 50/50 | 45/55 | 45/55 | 40/60 | 40/60 | 65/45 | 40/60 | 40/60 | 40/60 |
| WATER ABSORPTION OF FILM | 0.2861 | — | — | 0.7 | — | — | — | — | — |
| SPECIFIC GRAVITY OF FILM | 2.0651 | — | — | 2.14 | — | — | — | — | — |

[a]Teflon ® TE-30 (DuPont)
[b]Teflon ® FEP 120 (DuPont)
[c]Algoflon (Ausimont)
[d]GPL-10, 10 um nominal particle size (Harbison-Walker)
[e]amorphous fused silica, 1 um nominal particle size (Industrial Corp.)
[f]glass beads, 2 um nominal particle size (Potters Corp.)
[g]GELSIL ®, 1 um monosize sol gel silica (Geltech)
[h]Ti Pure, 0.2 um particle size (DuPont)
[i]amorphous silica, 20 um nominal particle size (Denka)
[j]1 um nominal particle size (TAN Ceramic)
[k]phenyltrimethoxysilane
[l]3:1 mixture of phenyltrimethoxysilane/(tridecafluoro, 1, 1, 2, 2, tetrahydrodecyl)-1-triethoxysilane (Petrarch Systems)
[m](tridecafluoro, 1, 1, 2, 2, tetrahydrodecyl)-1-triethoxysilane (Petrarch Systems)

Porous films produced by the process of the present invention have a wide range of potential applications, e.g. filtration membranes, breathable fabrics.

EXAMPLE 1

Thin films of particulate filled fluoropolymeric matrix composite material were made according to the process of the present invention.

Filler particles were pretreated with a silane coupling agent. A mixture of 6 parts by weight coated silica particles, 4 parts water and 0.05 parts surfactant (Triton X-100) was ball milled for 12 hours to form an aqueous filler dispersion.

An aqueous dispersion comprising 6 parts by weight fluoropolymer particles in 4 parts by water was mixed with the aqueous filler dispersion in relative amounts appropriate to give the filler loadings set forth below in TABLE 1.

The viscosity of the aqueous dispersion of polymer and filler was adjusted by adding a sufficient amount of a polyacrylic acid a viscosity modifying agent (Acrysol The tensile properties of sample film of composition 1 were determined. The film exhibited a tensile strength of 0.731 kpsi, an elongation at break of 167.4% and a tensile modulus of 4.62 kpsi.

A photomicrograph of a cross section of film composition 4 is shown in the FIGURE.

EXAMPLE 2

A porous thin film is made by the process set forth in Example 1 by using polymethylmethacrylate particles having a nominal size of 0.2 um as the filler material to produce a 1.0 mil thick film having a filler loading of 60 volume percent. The polymethylmethacrylic particles are thermally decomposed during the consolidation and sintering steps to produce a porous PTFE film having a void volume of 60 percent.

EXAMPLE 3

Exemplary casting compositions were continuously cast on a substrate using a #21 Mayer Rod. The films were consolidated by heating at 250° C. The film composition, substrate, substrate speed and film thickness are set forth in TABLE 2.

TABLE 2

| FILM COMPOSITION | SUBSTRATE | COATING SPEED (fpm) | FILM THICKNESS (mils) |
|---|---|---|---|
| 8 | 0.001" KAPTON | 5 | 0.45 |
| 8 | 0.001" KAPTON | 7.7 | 0.45 |
| 9 | 0.001" KAPTON | 9.1, 11.7 | 0.5 |
| 1 | 0.001" STAINLESS STEEL | 10 | 0.45 |
| 9 | 0.001" STAINLESS STEEL | 6.6 | 0.8 |

The above described films were of high quality and free of visually evident defects, e.g. pinholes, fisheyes and tears.

EXAMPLE 4

Filled fluoropolymer films were continuously cast on Mylar, Kapton and PTFE substrates and consolidated in a two zone (with zones set at 150° and 250° respectively) in-line oven.

The casting compositions were made by mixing an aqueous fluoropolymer dispersion with an aqueous dispersion of coated filler particles to give the relative amounts of fluoropolymer and filler particles set forth in TABLE 3. The matrix material, filler material, coating, surfactant, viscosity modifier, pH and viscosity for each film composition cast are set forth in TABLE 3. The amount of polymer matrix material, filler and surfactant are set forth in parts, the amount of coating is set forth as a weight percent of filler particles and the amount of viscosity modifier solids are expressed as a weight percent of total casting composition.

TABLE 3

| COMPOSITION NO. | 10 | 11 | 12 | 13 | 14 | 15 | 16 | 17 |
|---|---|---|---|---|---|---|---|---|
| POLYMER MATRIX (parts) | 60[a] | 60[b] | 60[b] | 60[b] | 60[b] | 60[b] | 60[b] | 60[c] |
| FILLER (parts) | 40[d] | 40[d] | 40[d] | 40[d] | 40[e] | 40[e] | 40[f] | 40[d] |
| COATING AGENT[g] (wt % filler) | 2 | 2 | 2 | 6 | 8 | 8 | 10 | 6 |
| SURFACTANT[h] (parts) | 3 | 3 | 3 | 3 | 3 | 3 | 3 | 3 |
| VISCOSITY MODIFER (wt %) | 0.20[i] | 0.159[j] | 0.129[j] | 0.095[k] | 0.129[j] | 0.139[j] | 0.171[j] | 0.150[j] |
| pH | 9.2 | 8.0 | 8.8 | 7.5 | 8.8 | 5.2 | 9.5 | 9.6 |
| VISCOSITY (cp) | 465 | 460 | 420 | 425 | 390 | 380 | 450 | 380 |

[a]FEP (FEP 120, DuPont)
[b]PTFE (D 60 Ausimont)
[c]PTFE (TE-30, DuPont)
[d]silica, Harbison-Walker 10 um nominal particle size
[e]silica, Harbison-Walker 8 um nominal particle size
[f]silica, Harbison-Walker 1 um nominal particle size
[g]1:3 mixture phenyltrimethoxysilane/(tridecafluoro, 1, 1, 2, 2, tetrahydrodecyl)-1-triethoxsilane (Petrarch Systems)
[h]Triton X-100
[i]ASE 75 (Rohm & Haas)
[j]ACRESOL GS (Rohm & Haas)
[k]Carbopol C 934 (B. F. Goodrich)

The composition number, substrate, coating rate (in feet per minute) (fpm)), oven temperature (expressed as first zone/second zone) and the thickness of the film for films cast using the pan fed knife-over-roll apparatus are given in TABLE 4 and for film cast using the nip fed three roll reverse coating apparatus are given in TABLE 5.

TABLE 4

| | KNIFE-COATED | | | |
|---|---|---|---|---|
| COMPOSITION NUMBER | 10 | 11 | 13 | 15 |
| SUBSTRATE | MYLAR | MYLAR | MYLAR | MYLAR |
| COATING RATE: linear feet substrate coated/ minute (fpm) | 3, 5, 10 15, 25, 35 | 5 | 5 | 3 |
| OVEN TEMPERATURE (°F.) | 150/250 | 120/150 | 120/150 | 150/250 |
| FILM THICKNESS (mils) | 0.9–1.0 | 0.6–0.7 | 0.5 | 1.20 |

| COMPOSITION NUMBER | 10 | 15 | 16 | 17 |
|---|---|---|---|---|
| SUBSTRATE | KAPTON | KAPTON | KAPTON | KAPTON |
| COATING RATE (fpm) | 5 | 5 | 5 | 5 |
| OVEN TEMPERATURE (°F.) | 120/150 | 120/150 | 120/150 | 120/150 |
| FILM THICKNESS (mils) | 0.7–0.9 | 0.8 | 1.0 | 0.8–0.9 |

| COMPOSITION NUMBER | 10 | 11 |
|---|---|---|
| SUBSTRATE | PTFE | PTFE |
| COATING RATE | 5 | 5 |

TABLE 4-continued

| (fpm) | | |
|---|---|---|
| OVEN TEMPERATURE (°F.) | 150/250 | 120/550 |
| FILM THICKNESS (mils) | 1.1 | 0.5, 1.0, 2.0 |

TABLE 5

| | 3 Roll-Coated | | | | |
|---|---|---|---|---|---|
| COMPOSITION NUMBER | 14 | 11 | 15 | 16 | 17 |
| SUBSTRATE | MYLAR | Stainless Steel | Stainless Steel | Stainless Steel | Stainless Steel |
| COATING RATE (fpm) | 5 | 5 | 5 | 5 | 5 |
| OVEN TEMPERATURE (°F.) | 120/250 | 120/250 | 120/250 | 120/250 | 120/250 |
| FILM THICKNESS (mils) | 1.0, 1.3, 1.5, 1.7 | 1.1 | 1.1 | 1.1 | 1.1 |

The above films cast using the knife-over-roll and reverse roll were of high quality and free of visually evident defects, e.g. pinholes, fisheyes and tears.

While preferred embodiments have been shown and described, various modifications and substitutions may be made thereto without departing from the spirit and scope of the invention. Accordingly, it is to be understood that the present invention has been described by way of illustrations and not limitations.

What is claimed is:

1. A method for making a porous fluoropolymer film, comprising:
    mixing fluoropolymer particles with a dispersion of a particulate filler in a carrier liquid comprising water to provide a casting composition which comprises an aqueous codispersion of fluoropolymer particles and filler particles;
    wherein said casting composition includes relative amounts of filler and fluoropolymer to provide a particulate filled composite film having greater than 15 volume percent filler;
    adding a surfactant to the casting composition to modify the surface tension of the carrier liquid so that the carrier liquid wets the filler particles and adding a viscosity modifier to adjust the viscosity of the casting composition to retard separation of the particulate filler from the composition and to provide a stabilized, homogeneous casting composition;
    casting a layer of the casting composition onto a substrate;
    consolidating the layer to form a particulate filled fluoropolymer matrix composite film; and
    removing the particulate filler from the consolidated layer to provide the porous fluoropolymer film.

2. The method of claim 1, wherein the fluoropolymer comprises polytetrafluoroethylene.

3. The method of claim 1, wherein the fluoropolymer comprises polychlorotrifluoroethylene.

4. The method of claim 1, wherein the fluoropolymer comprises a copolymer of tetrafluoroethylene and a monomer selected from the group consisting of hexafluoropropylene and perfluoroalkylvinylethers.

5. The method of claim 1, wherein the fluoropolymer comprises a copolymer of tetrafluoroethylene and a monomer selected from the group consisting of vinylidenefluoride, vinyl fluoride and ethylene.

6. The method of claim 1, wherein the fluoropolymer comprises a copolymer of chlorotrifluoroethylene and a monomer selected from the group consisting of hexafluoropropylene, perfluoroalkylvinylethers, vinylidenefluoride, vinyl fluoride, and ethylene.

7. The method of claim 1, wherein the filler particles comprise polystyrene particles or polymethylmethacrylate particles.

8. The method of claim 1, wherein the filler particles have a maximum equivalent spherical diameter of about 10 μm.

9. The method of claim 1, wherein the filler particles have a maximum equivalent diameter less than 5 μm.

10. The method of claim 1, wherein the porous fluoropolymeric film has a thickness less than about 2 mils.

11. The method of claim 1, wherein the porous fluoropolymeric film has a thickness of less than 1 mil.

12. The method of claim 1, wherein the viscosity modifier is selected from the group consisting of polyacrylic acid, vegetable gums and cellulose-based compounds.

13. The method of claim 1, wherein the layer is cast by reverse roll coating, dip coating, knife-over-roll coating, knife-over plate coating or metering rod coating.

14. The method of claim 1, wherein the filler particles are removed from the consolidated layer by thermal decomposition, chemical reaction or dissolution.

15. A method for making a porous fluoropolymer film, comprising:
    mixing the fluoropolymer with a dispersion of a particulate filler in a carrier liquid to provide a casting composition, said particulate filler comprising polystyrene particles or polymethylmethacrylate particles;
    wherein said casting composition includes relative amounts of filler and fluoropolymer to provide a particulate filled composite film having greater than 15 volume percent filler;
    casting a layer of the casting composition onto a substrate;
    consolidating the layer to form a particulate filled fluoropolymer matrix composite film; and
    removing the particulate filler from the consolidated layer to provide the porous fluoropolymer film.

16. A method for making a porous fluoropolymer film, comprising:
    mixing the fluoropolymer with a dispersion of a particulate filler in a carrier liquid to provide a casting composition, said particulate filler comprising filler particles having a maximum equivalent spherical diameter of about 10 μm;
    wherein said casting composition includes relative amounts of filler and fluoropolymer to provide a particulate filled composite film having greater than 15 volume percent filler;

adding a surfactant to the casting composition to modify the surface tension of the carrier liquid so that the carrier liquid wets the filler particles and adding a viscosity modifier to adjust the viscosity of the casting composition to retard separation of the particulate filler from the composition and to provide a stabilized, homogeneous casting composition;

casting a layer of the casting composition onto a substrate;

consolidating the layer to form a particulate filled fluoropolymer matrix composite film; and removing the particulate filler from the consolidated layer to provide the porous fluoropolymer film.

17. A method for making a porous fluoropolymer film, comprising:

mixing the fluoropolymer with a dispersion of a particulate filler in a carrier liquid to provide a casting composition;

wherein said casting composition includes relative amounts of filler and fluoropolymer to provide a particulate filled composite film having greater than 15 volume percent filler;

adding a surfactant to the casting composition to modify the surface tension of the carrier liquid so that the carrier liquid wets the filler particles and adjusting the viscosity of the casting composition using a viscosity modifier to prevent separation of the particulate filler from the composition and to provide a stabilized, homogeneous casting composition;

casting a layer of the casting composition onto a substrate;

consolidating the layer to form a particulate filled fluoropolymer matrix composite film; and removing the particulate filler from the consolidated layer to provide the porous fluoropolymer film.

18. The method of claim 9, wherein the viscosity modifier is selected from the group consisting of polyacrylic acid, vegetable gums and cellulose-based compounds.

19. A method for making a porous fluoropolymer film, comprising:

mixing the fluoropolymer particles with a dispersion of a chemically degradable particulate filler in a carrier liquid to provide a casting composition;

wherein said casting composition includes relative amounts of filler and fluoropolymer to provide a particulate filled composite film having greater than 15 volume percent filler;

adding a surfactant to the casting composition to modify the surface tension of the carrier liquid so that the carrier liquid wets the filler particles and adding a viscosity modifier to adjust the viscosity of the casting composition to retard separation of the particulate filler from the composition and to provide a stabilized, homogeneous casting composition;

casting a layer of the casting composition onto a substrate;

consolidating the layer to form a particulate filled fluoropolymer matrix composite film; and removing the thermally degradable particulate filler from the consolidated layer by thermal decomposition to provide the porous fluoropolymer film.

20. A method for making a porous fluoropolymer film, comprising:

mixing the fluoropolymer particles with a dispersion of a chemically degradable particulate filler in a carrier liquid to provide a casting composition;

wherein said casting composition includes relative amounts of filler and fluoropolymer to provide a particulate filled composite film having greater than 15 volume percent filler;

adding a surfactant to the casting composition to modify the surface tension of the carrier liquid so that the carrier liquid wets the filler particles and adding a viscosity modifier to adjust the viscosity of the casting composition to retard separation of the particulate filler from the composition and to provide a stabilized, homogeneous casting composition;

casting a layer of the casting composition onto a substrate;

consolidating the layer to form a particulate filled fluoropolymer matrix composite film; and removing the chemically degradable particulate filler from the consolidated layer to provide the porous fluoropolymer film.

21. A method for making a porous fluoropolymer film, comprising:

mixing fluoropolymer particles with a dispersion of a particulate filler in a carrier liquid comprising water to provide a casting composition which comprises an aqueous codispersion of fluoropolymer particles and filler particles wherein the fluoropolymer comprises polychlorotrifluoroethylene;

wherein said casting composition includes relative amounts of filler and fluoropolymer to provide a particulate filled composite film having greater than 15 volume percent filler;

casting a layer of the casting composition onto a substrate;

consolidating the layer to form a particulate filled fluoropolymer matrix composite film; and removing the particulate filler from the consolidated layer to provide the porous fluoropolymer film.

22. A method for making a porous fluoropolymer film, comprising:

mixing fluoropolymer particles with a dispersion of a particulate filler in a carrier liquid comprising water to provide a casting composition which comprises an aqueous codispersion of fluoropolymer particles and filler particles wherein the fluoropolymer comprises a copolymer of tetrafluoroethylene and a monomer selected from the group consisting of hexafluoropropylene and perfluoroalkylvinylethers;

wherein said casting composition includes relative amounts of filler and fluoropolymer to provide a particulate filled composite film having greater than 15 volume percent filler;

casting a layer of the casting composition onto a substrate;

consolidating the layer to form a particulate filled fluoropolymer matrix composite film; and removing the particulate filler from the consolidated layer to provide the porous fluoropolymer film.

23. A method for making a porous fluoropolymer film, comprising:

mixing fluoropolymer particles with a dispersion of a particulate filler in a carrier liquid comprising water to provide a casting composition which comprises an aqueous codispersion of fluoropolymer particles and filler particles wherein the fiuoropolymer comprises a copolymer of tetrafluoroethylene and a monomer selected from the group consisting of vinylidenefluoride, vinyl fluoride, and ethylene;

wherein said casting composition includes relative amounts of filler and fluoropolymer to provide a particulate filled composite film having greater than 15 volume percent filler;

casting a layer of the casting composition onto a substrate;

consolidating the layer to form a particulate filled fluoropolymer matrix composite film; and removing the particulate filler from the consolidated layer to provide the porous fluoropolymer film.

24. A method for making a porous fluoropolymer film, comprising:

mixing fluoropolymer particles with a dispersion of a particulate filler in a carrier liquid comprising water to provide a casting composition which comprises an aqueous codispersion of fluoropolymer particles and filler particles wherein the fluoropolymer comprises a copolymer of chlorotrifluoroethylene and a monomer selected from the group consisting of hexafluoropropylene, perfluoroalkylvinylethers, vinylidenefluoride, vinyl fluoride, and ethylene;

wherein said casting composition includes relative amounts of filler and fluoropolymer to provide a particulate filled composite film having greater than 15 volume percent filler;

casting a layer of the casting composition onto a substrate;

consolidating the layer to form a particulate filled fluoropolymer matrix composite film; and removing the particulate filler from the consolidated layer to provide the porous fluoropolymer film.

* * * * *